United States Patent
Jang et al.

(10) Patent No.: US 8,804,080 B2
(45) Date of Patent: Aug. 12, 2014

(54) LIQUID CRYSTAL DISPLAY DEVICE AND METHOD OF FABRICATING THEREOF

(71) Applicant: LG Display Co., Ltd., Seoul (KR)

(72) Inventors: Hun Jang, Gyeonggi-do (KR); JoonYoung Yang, Gyeonggi-do (KR)

(73) Assignee: LG Display Co., Ltd., Seoul (KR)

( * ) Notice: Subject to any disclaimer, the term of this patent is extended or adjusted under 35 U.S.C. 154(b) by 50 days.

(21) Appl. No.: 13/713,427

(22) Filed: Dec. 13, 2012

(65) Prior Publication Data

US 2013/0155356 A1 Jun. 20, 2013

(30) Foreign Application Priority Data

Dec. 14, 2011 (KR) ........................ 10-2011-0134787

(51) Int. Cl.
*G02F 1/1343* (2006.01)

(52) U.S. Cl.
USPC .......................................................... 349/139

(58) Field of Classification Search
None
See application file for complete search history.

(56) References Cited

U.S. PATENT DOCUMENTS

| | | | |
|---|---|---|---|
| 2006/0034125 A1 | 2/2006 | Kim et al. | |
| 2006/0290859 A1* | 12/2006 | Ko et al. | 349/139 |
| 2011/0108314 A1* | 5/2011 | Pan et al. | 174/261 |

FOREIGN PATENT DOCUMENTS

| | | |
|---|---|---|
| JP | 5-173188 | 7/1993 |
| JP | 2006-48051 | 2/2006 |
| JP | 2010-85810 | 4/2010 |

OTHER PUBLICATIONS

Office Action from Japanese Patent Office in counterpart Japanese Patent Application mailed Oct. 31, 2013.

* cited by examiner

*Primary Examiner* — Thanh-Nhan P Nguyen
(74) *Attorney, Agent, or Firm* — Morgan, Lewis & Bockius LLP

(57) ABSTRACT

Disclosed is a liquid crystal display (LCD) device capable of enhancing an aperture ratio and a transmittance ratio. The LCD device includes a first substrate and a second substrate; a plurality of gate lines formed on the first substrate, each gate line having a first region and a second region with the width less than that of the first region; a plurality of data lines disposed so as to be perpendicular to the gate lines to define a plurality of pixel regions; a thin film transistor (TFT) formed on the first region of the gate line; a common electrode and a pixel electrode formed on the first substrate, and forming an electric field; a black matrix and a color filter layer formed on the second substrate; and a liquid crystal (LC) layer formed between the first substrate and the second substrate, wherein the first regions and the second regions of the gate lines are alternately disposed in an extending direction of the gate lines and in an extending direction of the data lines, and wherein two TFTs are formed on the first region of the gate line corresponding to the pixel region, two TFTS being respectively connected to pixel electrodes of two pixel regions adjacent to each other based on the gate line.

13 Claims, 13 Drawing Sheets

LIQUID CRYSTAL DISPLAY DEVICE AND METHOD OF FABRICATING THEREOF

CROSS-REFERENCE TO RELATED APPLICATION

Pursuant to 35 U.S.C. §119(a), this application claims the benefit of earlier filing date and right of priority to Korean Application No. 10-2011-0134787, filed on Dec. 14, 2011, the contents of which is incorporated by reference herein in its entirety.

BACKGROUND OF THE INVENTION

1. Field of the Invention

The present disclosure relates to a liquid crystal display (LCD) device and a method for fabricating the same, and more particularly, to an LCD device capable of enhancing an aperture ratio and a transmittance ratio, and a method for fabricating the same.

2. Background of the Invention

Recently, as a demand for portable information media increases with high concerns about information display, a light, thin and small flat panel display (FPD) device replacing the conventional display device, a cathode ray tube (CRT) is being spotlighted. Research on the FPD and commercialization thereof are being actively done. Among such FPD devices, a liquid crystal display (LCD) device which displays an image using optical anisotropy of a liquid crystal, is widely applied to a notebook computer, a desk top monitor, etc. owing to its superior resolution, color display, picture quality, etc.

The LCD device largely consists of a color filter substrate, an array substrate, and a liquid crystal layer formed between the color filter substrate and the array substrate.

A representative driving method for the LCD device, an active matrix (AM) method is a method for driving a liquid crystal of a pixel region by using an amorphous silicon thin film transistor (a-Si TFT) as a switching device.

Hereinafter, a structure of the conventional LCD device will be explained in more details with reference to FIG. 1.

FIG. 1 is an exploded perspective view schematically illustrating a structure of a liquid crystal display (LCD) device in accordance with the related art.

As shown, the LCD device largely consists of a color filter substrate 5, an array substrate 10, and an LC layer 30 formed between the color filter substrate 5 and the array substrate 10.

The color filter substrate 5 includes a color filter (C) consisting of a plurality of sub color filters 7 for implementing colors of red, green and blue (RGB); a black matrix 6 for separating the sub color filters 7 from each other, and blocking light which penetrates through the LC layer 30; and a transparent common electrode 8 for applying a voltage to the LC layer 30.

The array substrate 10 includes a plurality of gate lines 16 and data lines 17 which define a plurality of pixel regions (P) by crossing each other; thin film transistors (TFT) formed at intersections between the gate lines 16 and the data lines 17; and pixel electrodes 18 formed on the pixel regions (P).

The color filter substrate 5 and the array substrate 10 are disposed to face each other, and are attached to each other by a sealant (not shown) formed at the outer periphery of an image display region, thereby implementing an LCD panel. The color filter substrate 5 and the array substrate 10 are attached to each other by a bonding key (not shown) formed at the color filter substrate 5 or the array substrate 10.

As a general driving method for the LCD device, there is a twisted nematic (TN) method for driving nematic phase LC molecules in a direction perpendicular to a substrate. However, the TN method has a disadvantage that a viewing angle is narrow (e.g., about 90°), which results from refractive anisotropy of LC molecules. More specifically, the reason why the viewing angle is narrow is because LC molecules aligned in a horizontal direction with respect to the substrate are aligned in a direction perpendicular to the substrate, when a voltage is applied to an LCD panel.

In order to solve such problem, there has been proposed a Fringe FieldIn Switching (FFS) mode LCD device for enhancing a viewing angle to 170° or more, by driving LC molecules in a horizontal direction with respect to the substrate. This will be explained in more details.

FIG. 2 is a planar view illustrating a structure of an FFS mode LCD device in accordance with the related art.

As shown in FIG. 2, in the conventional FFS mode LCD device 10, a plurality of gate lines 16 and data lines 17 are formed on a transparent substrate (array substrate) in horizontal and vertical directions (i.e., they cross each other), thus to define a plurality of pixel regions. A thin film transistor (TFT) 20, a switching device is formed at each intersection between the gate line 16 and the data line 17. Generally, the gate line 16 is formed in 'N' in number, and the data line 17 is formed in 'M' in number, thereby forming 'N×M' pixel regions. However, for convenience, a single pixel region is illustrated in the drawings.

The TFT 20 includes a gate electrode 21 connected to the gate line 16, a source electrode 22 connected to the data line 17, and a drain electrode 23 connected to a pixel electrode 18.

Also, the TFT 20 includes gate insulation layers (not shown) for insulating the gate electrode 21 and the source/drain electrodes 22 and 23 from each other, and a semiconductor layer 25 (i.e., active pattern) for forming a conductive channel between the source electrode 22 and the drain electrode 23 by a gate voltage supplied to the gate electrode 21.

In the pixel region, box-shaped common electrode 8 and pixel electrode 18 are formed. The common electrode 8 includes a plurality of slits 8s therein so as to generate a fringe field together with the pixel electrode 18.

The common electrode 8 is electrically connected to a common line 81 disposed in parallel to the gate line 16, through a contact hole 40 of an insulation layer (not shown).

In the FFS mode LCD device, as a scan signal is applied to the gate electrode 21 of the TFT 20 through the gate line 16, the semiconductor layer 25 of the TFT 20 is activated, thereby forming a conductive channel. At the same time, an image signal input to the data line 17 is input to the pixel electrode 18 via the source electrode 22 and the drain electrode 23 of the TFT 20. As a result, an electric field is formed between the common electrode 8 and the pixel electrode 18, so that an image is implemented.

However, the conventional FFS mode LCD device has the following problems.

As shown in FIG. 2, the TFT 20 is formed at each pixel region, and the common electrode 8 and the pixel electrode 18 are not formed at a region where the TFT 20 is formed. The region where the TFT 20, the gate line 16 and the data line 17 are formed, is a non-display region where an image is not implemented. Light may leak to the non-display regions, and thus picture quality may be lowered. Therefore, the non-display regions should be blocked by a black matrix 42 formed of black resin, etc., so that light transmittance can be prevented.

The TFT 20 occupies most of a lower region of a pixel. That is, a region (A) disposed at an image display region of a pixel adjacent to the TFT 20 of a corresponding pixel has an area smaller than that of the TFT 20. The common electrode 8 and the pixel electrode 18 are formed at the region A. However, the region A is not an image display region, when considering a processing margin at the time of forming a TFT of an LCD device, or an attachment margin between a TFT array substrate and a color filter substrate. Therefore, the black matrix 42 is entirely formed on the lower region of the pixel so as to cover the region A.

In the conventional LCD device, the lower region of the pixel where the TFT 20 is formed is an non-display region where light transmittance is prevented. This may cause an aperture ratio and a transmittance ratio of the LCD device to be lowered.

SUMMARY OF THE INVENTION

Therefore, an aspect of the detailed description is to provide a liquid crystal display (LCD) device capable of enhancing an aperture ratio and a transmittance ratio, by allowing two adjacent pixels to share a single gate line, and a method for fabricating the same.

To achieve these and other advantages and in accordance with the purpose of this specification, as embodied and broadly described herein, there is provided a liquid crystal display (LCD) device, comprising: a first substrate and a second substrate; a plurality of gate lines formed on the first substrate, each gate line having a first region and a second region with the width less than that of the first region; a plurality of data lines disposed so as to be perpendicular to the gate lines to define a plurality of pixel regions; a thin film transistor (TFT) formed on the first region of the gate line; a common electrode and a pixel electrode formed on the first substrate, and forming an electric field; a black matrix and a color filter layer formed on the second substrate; and a liquid crystal (LC) layer formed between the first substrate and the second substrate, wherein the first regions and the second regions of the gate lines are alternately disposed in an extending direction of the gate lines and in an extending direction of the data lines, and wherein two TFTs are formed on the first region of the gate line corresponding to the pixel region, two TFTS being respectively connected to pixel electrodes of two pixel regions adjacent to each other based on the gate line.

Drain electrodes of two TFTs formed on a single gate line in a pixel region may be disposed in parallel to a data line of a corresponding pixel and a data line of an adjacent pixel, thereby facing the data lines. An area of a pixel region corresponding to the first region of the gate line may be smaller than that of a pixel region corresponding to the second region. The pixel electrode may be formed over a gate insulation layer in a dummy pattern, and the common electrode may be formed over a passivation layer so that a plurality of slits extending in an extending direction of the data line are formed.

To achieve these and other advantages and in accordance with the purpose of this specification, as embodied and broadly described herein, there is also provided a method for fabricating a liquid crystal display (LCD) device, the method comprising: providing a first substrate and a second substrate; forming a plurality of gate lines on the first substrate, each gate line including as first regions and second regions having a small width than that of the first regions are alternately disposed with each other; forming a gate insulation layer over the first substrate having the gate lines formed thereon; forming two semiconductor layers on the gate insulation layer above the first region of the gate line; forming data lines and drain electrodes on the semiconductor layer, the data lines perpendicular to the gate lines to define a plurality of pixel regions, the drain electrodes facing with a part of the data lines; forming a passivation layer over the first substrate having the drain electrodes formed thereon; forming a black matrix and a color filter layer on the second substrate corresponding to the gate lines and the data lines of the first substrate; and attaching the first substrate and the second substrate to each other, and forming a liquid crystal layer between the first and second substrates, Further scope of applicability of the present application will become more apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from the detailed description.

BRIEF DESCRIPTION OF THE DRAWINGS

The accompanying drawings, which are included to provide a further understanding of the invention and are incorporated in and constitute a part of this specification, illustrate exemplary embodiments and together with the description serve to explain the principles of the invention.

In the drawings.

DETAILED DESCRIPTION OF THE INVENTION

Description will now be given in detail of the exemplary embodiments, with reference to the accompanying drawings. For the sake of brief description with reference to the drawings, the same or equivalent components will be provided with the same reference numbers, and description thereof will not be repeated.

Hereinafter, the present invention will be explained in more details with reference to the attached drawings.

Figure 3A:
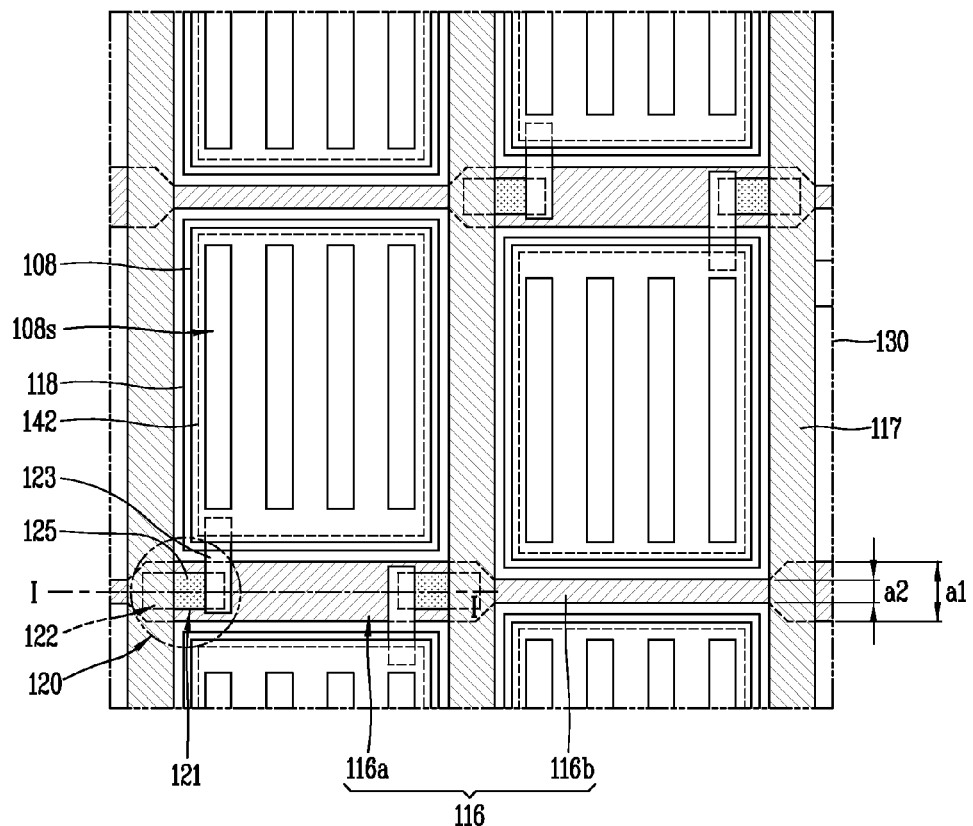
FIG. 3A is a view illustrating a structure of a liquid crystal display (LCD) device according to an embodiment of the present invention.
Figure 3B:
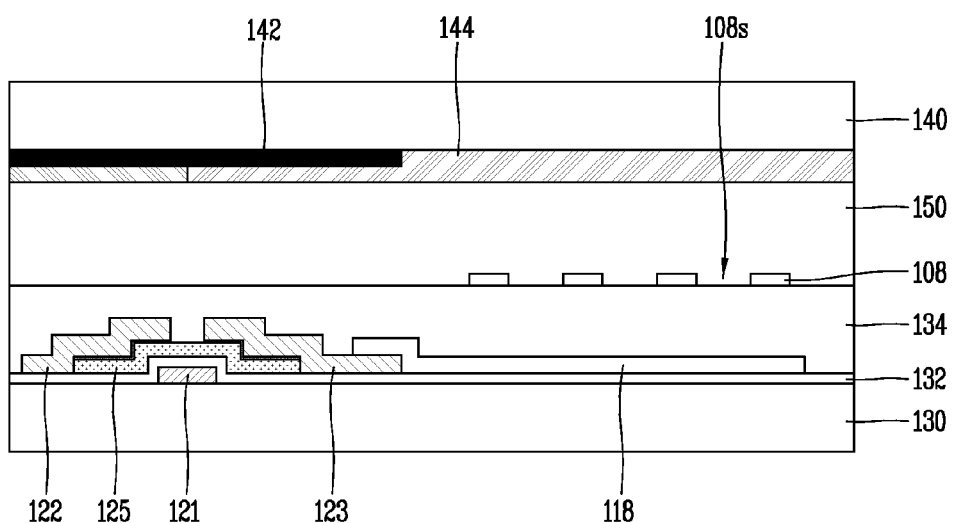
FIG. 3B is a sectional view taken along line I-I' in FIG. 3A.

FIG. 3 is a view illustrating a structure of a liquid crystal display (LCD) device according to the present invention. More specifically, FIG. 3A illustrates two adjacent pixels, and FIG. 3B, a sectional view taken along line I-I' in FIG. 3A illustrates a structure of a single pixel.

As shown in FIG. 3A, the LCD device according to the present invention includes a plurality of gate lines 116 and data lines 117 which define a plurality of pixel regions, and thin film transistors (TFTs) 120 formed at the pixel regions. Generally, a plurality of pixel regions are formed at the LCD device. However, for convenience, only two pixel regions adjacent to each other right and left based on the data line 117 are illustrated in the drawings.

The TFT 120 is formed on the gate line 116. That is, a region 121 of the gate line 116 serves as a gate electrode, and a semiconductor layer 125 is formed on the region 121. In the present invention, a region 122 of the data line 117 serves as a source electrode. That is, in the conventional art, a TFT is formed as a gate electrode protrudes from a gate line and a source electrode protrudes from a data line. However, in the present invention, parts of the gate line and the data line serve as the gate electrode and the source electrode, without a protruding structure of the gate electrode and the source electrode.

A drain electrode 123 is formed to cross the gate line 116. The drain electrode 123 faces the source electrode region 122 of the data line 117 with a constant interval, and the semiconductor layer 125 is formed below the drain electrode 123. As the semiconductor layer 125 extends up to the drain electrode 123 and the source electrode region 122 of the data line 117 from the lower part of the drain electrode 123, the semiconductor layer 125 on the drain electrode 123 and the source electrode region 122 changes to a channel layer.

The gate line 116 is divided into two regions. As shown, the gate line 116 is divided into a first region 116a having a relatively larger width (a1), and a second region 116b having a relatively smaller width (a2). The first region 116a and the second region 116b are alternately formed in an extending direction of the gate line 116, i.e., in a horizontal direction. That is, the gate line 116 is formed in a zigzag shape in an extending direction of the gate line 116, and in an extending direction of the data line 117.

Each of the first region 116a and the second region 116b corresponds to a single pixel. That is, if the gate line 116 corresponding to one pixel has a first region 116a with a large width, the gate line 116 corresponding to another pixel has a second region 116b with a small width. Here, said another pixel is adjacent to said one pixel in an extending direction of the gate line 116 and in an extending direction of the data line 117.

The TFT 120 is formed at the first region 116a of the gate line 116. On the first region 116a of the gate line 116 corresponding to one pixel, two TFTs 120 are formed. Here, one TFT is connected to a corresponding pixel, and another TFT is connected to an adjacent pixel in an extending direction of the data line 117. In the present invention, two pixels adjacent to each other in upper and lower directions share the first region 116a of the gate line 116 with a larger width.

The gate line 116 is divided into the first region 116a with a larger width, and the second region 116b with a smaller width. And, two TFTs 120 for applying signals to two pixels adjacent to each other in an extending direction of the data line 117, are formed at the first region 116a, so that the two adjacent pixels can share a single gate line 116. The present invention has such configurations due to the following reasons.

As aforementioned, a single TFT is formed at each pixel in the conventional LCD device. The TFT is formed at a lower region of each pixel, and occupies most of the lower region. That is, a region between the TFT 120 of one pixel, and the data line 117 of an adjacent pixel is smaller than a region of the TFT 120. When considering a processing margin at the time of forming a TFT of an LCD device, or an attachment margin between a TFT array substrate and a color filter substrate, said region corresponds to a dead area where an image is not implemented. Therefore, a black matrix covers up to said region.

In the present invention, a TFT of an adjacent pixel is formed at the dead region, thereby changing the dead region into a TFT forming region. That is, as a TFT of an adjacent pixel is formed at a dead region of a corresponding pixel, a region where the TFT of the adjacent pixel is to be formed, and the dead region are changed into display regions for displaying images. This can enhance an aperture ratio and a transmittance ratio.

Figure 1:
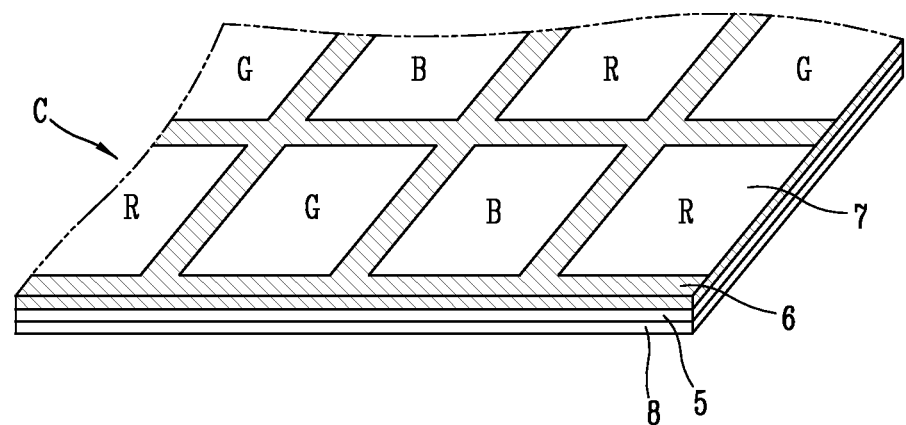
FIG. 1 is a view illustrating a structure of a liquid crystal display (LCD) device in accordance with the related art.
Figure 1:
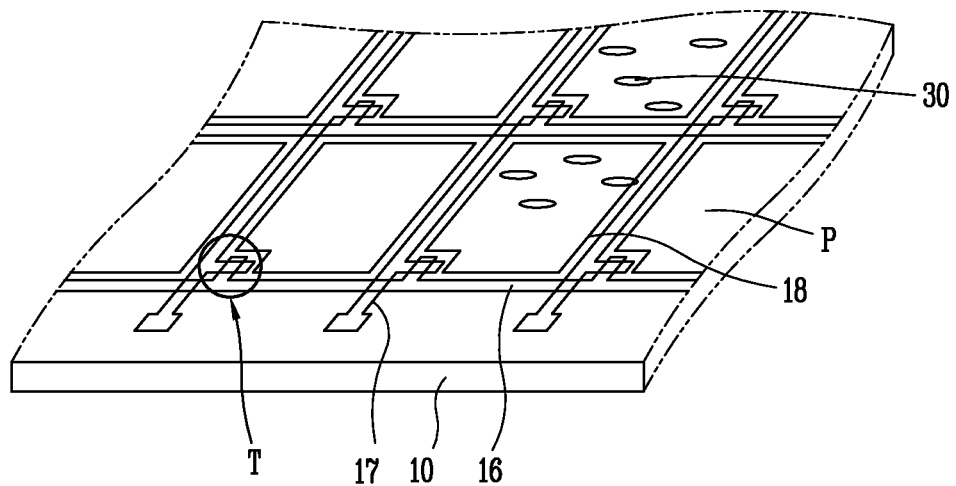
Figure 2:
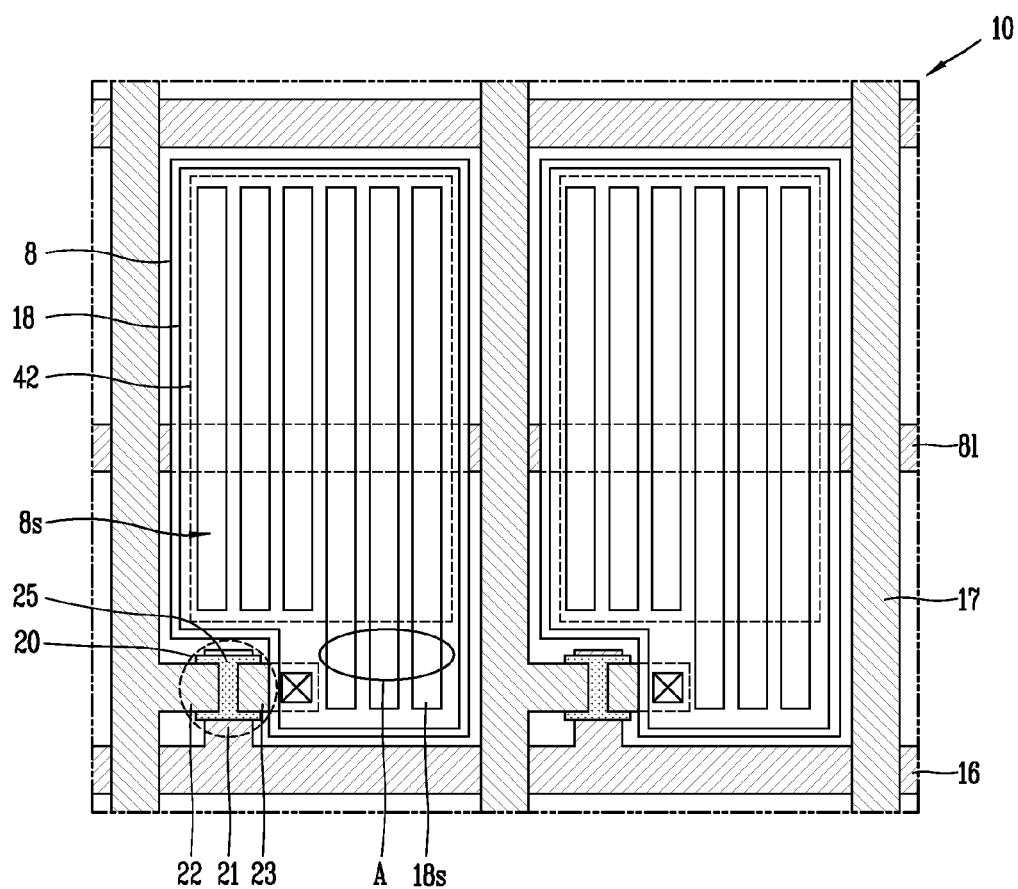
FIG. 2 is a planar view illustrating a structure of a liquid crystal display (LCD) device in accordance with the related art.

As shown, the width (a1) of the first region 116a of the gate line 116 having the TFT 120 formed thereon, is similar to widths of a TFT forming region and a dead region covered by a black matrix in the conventional LCD device shown in FIG. 2. On the other hand, the width (a2) of the second region 116b of the gate line 116 is much less than the width (a1) of the first region 116a. A region corresponding to the width (a2) serves as a display region. Since an image display region of a pixel corresponding to the second region 116b is much larger than the conventional image display region of a pixel, an aperture ratio and a transmittance ratio are enhanced.

In the present invention, the first region 116a and the second region 116b of the gate line 116 are alternately formed in an extending direction of the gate line 116 and in an extending direction of the data line 117. Therefore, a pixel having a relatively smaller display region, and a pixel having a relatively larger display region are alternately formed in an extending direction of the gate line 116 and in an extending direction of the data line 117. And, the display region corresponding to the half of the entire pixel has a wider area than that of the conventional display region. This can greatly enhance an aperture ratio and a transmittance ratio.

As shown in FIG. 3A, a pixel electrode 118 and a common electrode 108 are formed in each pixel. Each of the pixel electrode 118 and the common electrode 108 is formed in a pixel in a quadrangular shape. A plurality of slits 108s having a belt shape at constant widths are formed at the common electrode 108, in a direction of the data line 117, as part of the common electrode 108 is removed.

In the drawings, for convenience, the pixel electrode 118 and the common electrode 108 have different areas. However, the pixel electrode 118 and the common electrode 108 may be formed to have the same area.

In the LCD device, a black matrix 142 for blocking an non-display region is formed to cover the gate line 116 and the data line 117. In this case, the black matrix 142 which covers the first region 116a of the gate line 116 has a relatively larger width, whereas the black matrix 142 which covers the second region 116b of the gate line 116 has a relatively smaller width. As a result, an image display region of a pixel corresponding to the second region 116b has an area much larger than that of the conventional one.

The LCD device of the present invention will be explained in more details with reference to FIG. 3B.

As shown in FIG. 3B, a gate electrode 121 is formed on a first substrate 130 formed of transparent material such as glass, and a gate insulation layer 132 is formed over the first substrate 130 having the gate electrode 121 thereon. Although not shown, the gate electrode 121 is formed on the first substrate 130 as part of a gate line.

A semiconductor layer 125 is formed on the gate insulation layer 132. The semiconductor layer 125 is an active pattern formed of semiconductor material such as amorphous silicone (a-Si), which has a conductive channel therein as a signal is applied to the gate electrode 121. The semiconductor layer 125 is formed along a first region 116a of a gate line 116.

A source electrode 122 and a drain electrode 123 are formed over the semiconductor layer 125. The source electrode 122 is formed as part of a data line 117, and the drain electrode 123 is formed to cross the first region 116a of the gate line 116 in parallel to the data line 117.

Although not shown, ohmic contact layers formed of impurity-included semiconductor material, and configured to ohmic-contact the semiconductor layer 125 and the source/drain electrodes 122 and 123 from each other are formed between the semiconductor layer 125 and the source/drain electrodes 122 and 123.

A pixel electrode 118 is formed over the gate insulation layer 132 inside the pixel. The pixel electrode 118 is formed of transparent conductive material such as indium tin oxide (ITO) and indium zinc oxide (IZO), and extends up to the upper part of the drain electrode 123 of the TFT thus to be electrically connected to the drain electrode 123. The pixel electrode 118 is formed, in the pixel, so as to have the approximately same shape as that of the pixel.

A passivation layer 134 is formed over the first substrate 130 having the source electrode 122 and the drain electrode 123 formed thereon. And, a common electrode 108 having a plurality of slits 108s is formed over the passivation layer 134.

Although not shown, contact holes are formed at the gate insulation layer 132 and the passivation layer 134, so that the common electrode 108 can be electrically connected to a common line (not shown) for applying a common voltage to the common electrode 108 through the contact holes.

A black matrix 142 and a color filter layer 144 are formed on a second substrate 140 formed of transparent material such as glass. The black matrix 142 is formed along a gate line and data line forming region, so that lowering of picture quality due to light transmittance into the gate line and data forming region can be prevented. Since the gate line 116 is formed such that first regions 116a having a large width and second regions 116b having a small width are alternately disposed with each other, the black matrix 142 formed along the gate line 116 is also formed such that regions having a large width and regions having a small width are alternately disposed with each other.

The color filter layer 144 includes red (R), green (G) and blue (B) color filters, thereby implementing substantial colors. Although not shown, an overcoat layer may be formed on the color filter layer 144.

The first substrate 130 having a TFT formed thereon and the second substrate 140 having the color filter 144 formed thereon are attached to each other, and an LC layer 150 is formed between the first substrate 130 and the second substrate 140. As a result, an LCD device is completed.

Figure 4:
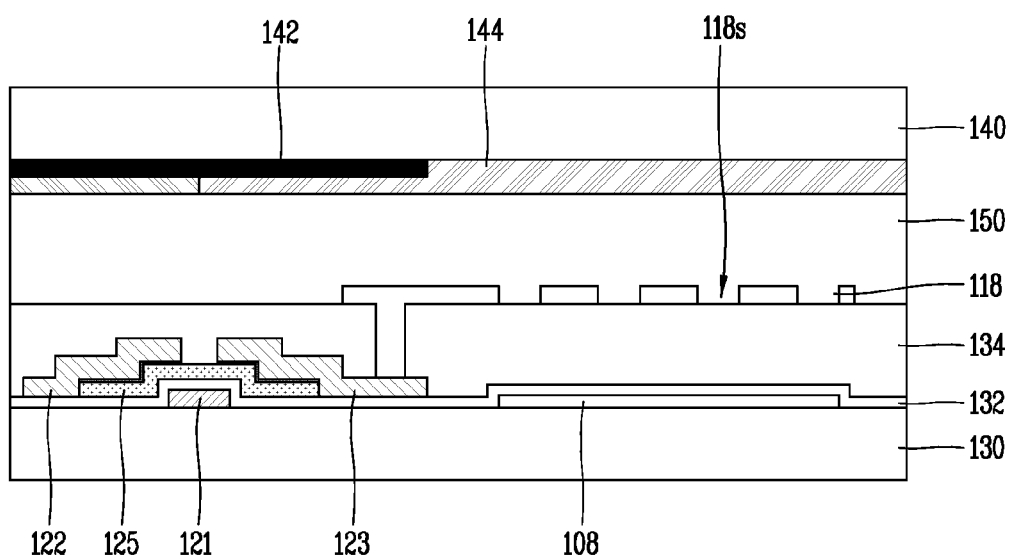
FIG. 4 is a sectional view illustrating another structure of a liquid crystal display (LCD) device according to an embodiment of the present invention.

The common electrode 108 and the pixel electrode 118 may be formed over various layers, not over a specific layer. For instance, as shown in FIG. 4, the common electrode 108 may be formed in a pixel region on the first substrate 130, in the same shape as the pixel shape, and the pixel electrode 118 may be formed over the passivation layer 134. Here, the pixel electrode 118 is electrically connected to the drain electrode 123 of the TFT, through the contact hole formed at the passivation layer 134. Since a plurality of slits 118s having a belt shape are formed at the pixel electrode 118 so as to extend in a direction of the data line 117, an electric field is formed between the common electrode 108 and the pixel electrode 118.

Alternatively, the common electrode 108 may be formed over the gate insulation layer 132, and the pixel electrode 118 may be formed on the passivation layer 134.

In the LCD device, a plurality of slits 108s having a belt shape are formed at the common electrode 108 in a direction of the data line 117, whereas the pixel electrode 118 is formed to have a dummy pattern like the pixel. Accordingly, once a signal is applied to the pixel electrode 118, an electric field is generated between the slits 108s of the common electrode 108 and the pixel electrode 118 disposed therebelow. The electric field is formed between the edges of the slits 108s of the common electrode 108 on the surface of the pixel electrode 118, and the electric field has a parabolic shape implemented from the lower side to the upper side. The electric field is formed, on the LC layer 150, so as to be parallel to the surfaces of the first substrate 130 and the second substrate 140. As LC molecules are switched along the electric field, a transmittance ratio of light passing through the LC layer 150 is controlled to implement an image.

As shown in FIG. 3A, once a scan signal is applied to the gate line 116, the scan signal is applied to TFTs connected to the gate line 116, thereby turning on the TFTs. In the present invention, TFTs of pixels adjacent to each other in upper and lower directions are formed on a single gate line 116, and the two TFTs are connected to pixel electrodes of the upper and lower pixels, respectively. Accordingly, a scan signal is applied to a single gate line 116, and the TFTs connected to the upper and lower pixels adjacent to each other based on the gate line 116 are simultaneously driven.

Here, source electrodes of the two TFTs formed at a single gate line 116 are connected to different data lines 117. Accordingly, even if the pixels adjacent to each other in upper and lower directions are simultaneously driven by the same scan signal, image signals are applied from the different data lines. As a result, the adjacent pixels do not implement the same image. In the present invention, two adjacent pixels share a single gate line. Accordingly, even if the two pixels are simultaneously driven, various driving such as line inversion driving and dot inversion driving can be implemented by controlling image signals applied to the respective pixels.

Hereinafter, a method for fabricating an LCD device according to the present invention will be explained in more details.

FIGS. 5A to 5E are sectional views illustrating a method for fabricating an LCD device according to an embodiment of the present invention, and FIGS. 6A to 6E are sectional views illustrating a method for fabricating an LCD device according to an embodiment of the present invention.

Figure 5A:
FIGS. 5A to 5E are sectional views illustrating a method for fabricating an LCD device according to an embodiment of the present invention.
Figure 6A:
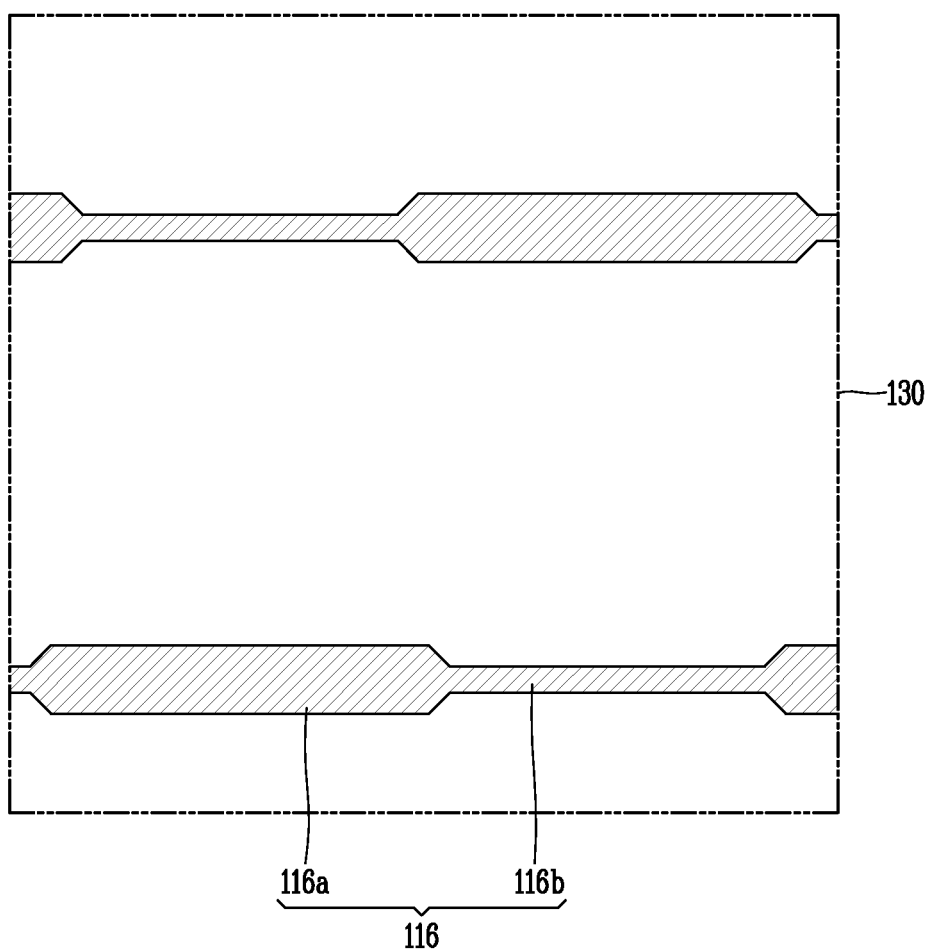
FIGS. 6A to 6E are sectional views illustrating a method for fabricating an LCD device according to an embodiment of the present invention.

As shown in FIGS. 5A and 6A, opaque metal having superior conductivity, such as Cr, Mo, Ta, Cu, Ti, Al and Al alloy, is deposited on a first substrate 130 formed of transparent material such as glass, by a sputtering process. Then, the opaque metal is etched by a photolithography process, thereby forming gate lines 116. The gate lines 116 are formed so that first regions 116a having a large width and second regions 116b having a small width are alternately disposed with each other in a horizontal direction. Also, the gate lines 116 are formed so that first regions 116a having a large width and second regions 116b having a small width are alternately disposed with each other in a vertical direction.

A gate electrode 121 is part of the gate line 116. Even if the gate electrode 121 and the gate line 116 have the same configuration, they are classified from each other for convenience.

Figure 5B:
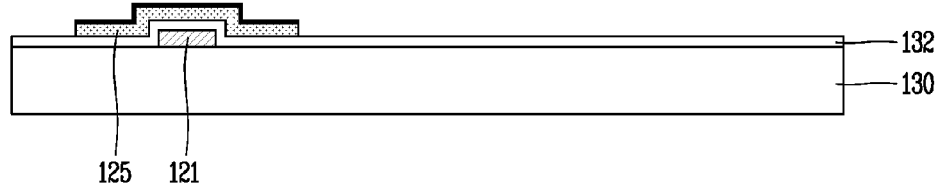
Figure 6B:
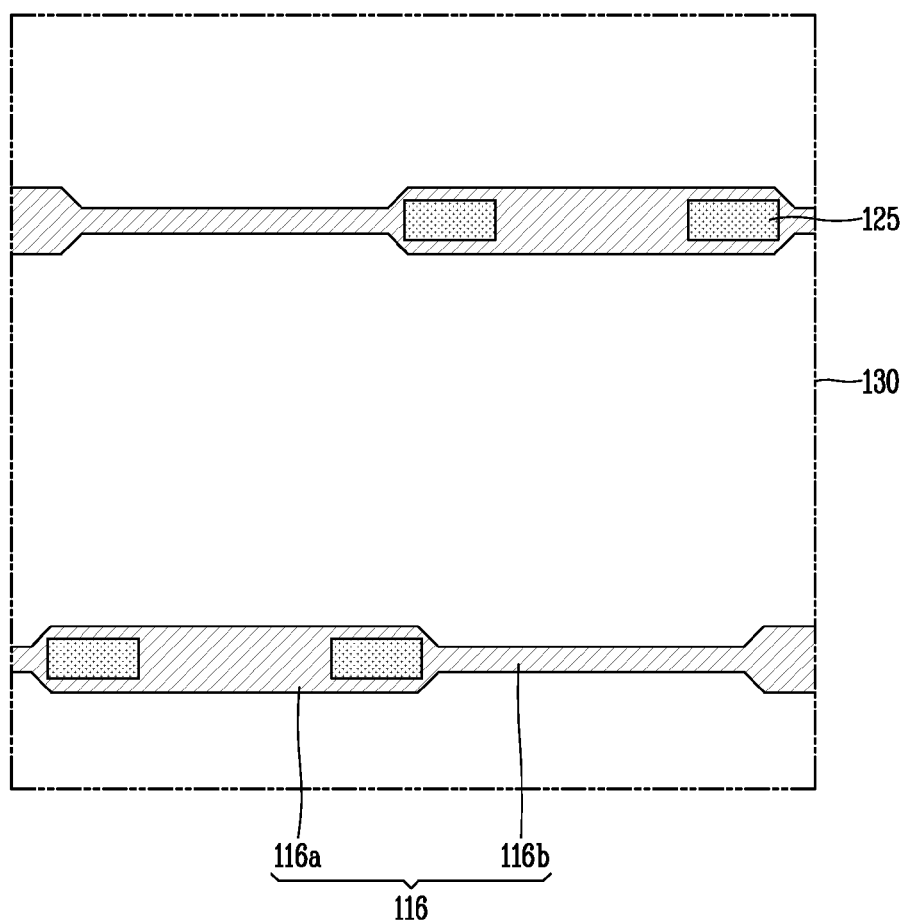

As shown in FIGS. 5B and 6B, inorganic insulating material such as SiOx and SiNx is deposited on the first substrate 130 having the gate line 116 formed thereon, by a chemical vapor deposition (CVD) method, thereby forming a gate insulation layer 132. Then, semiconductor material such as amorphous silicone (a-Si) is deposited on the gate insulation layer 132 by a CVD method, and then is etched, thereby forming a semiconductor layer 125 on the gate insulation layer 132 above the first region 116a of the gate line 116. A single first region 116a is provided with two semiconductor layers 125.

Figure 5C:
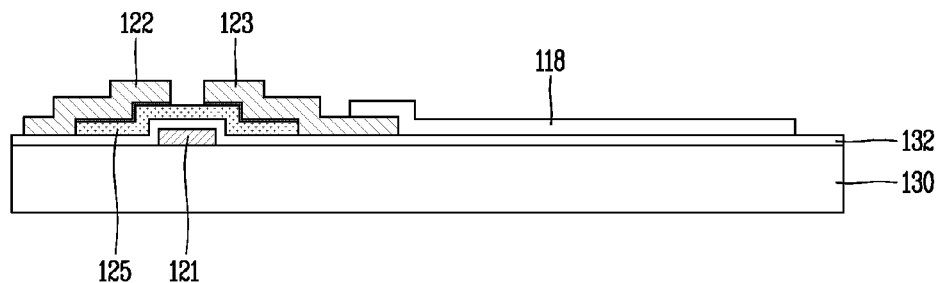
Figure 6C:
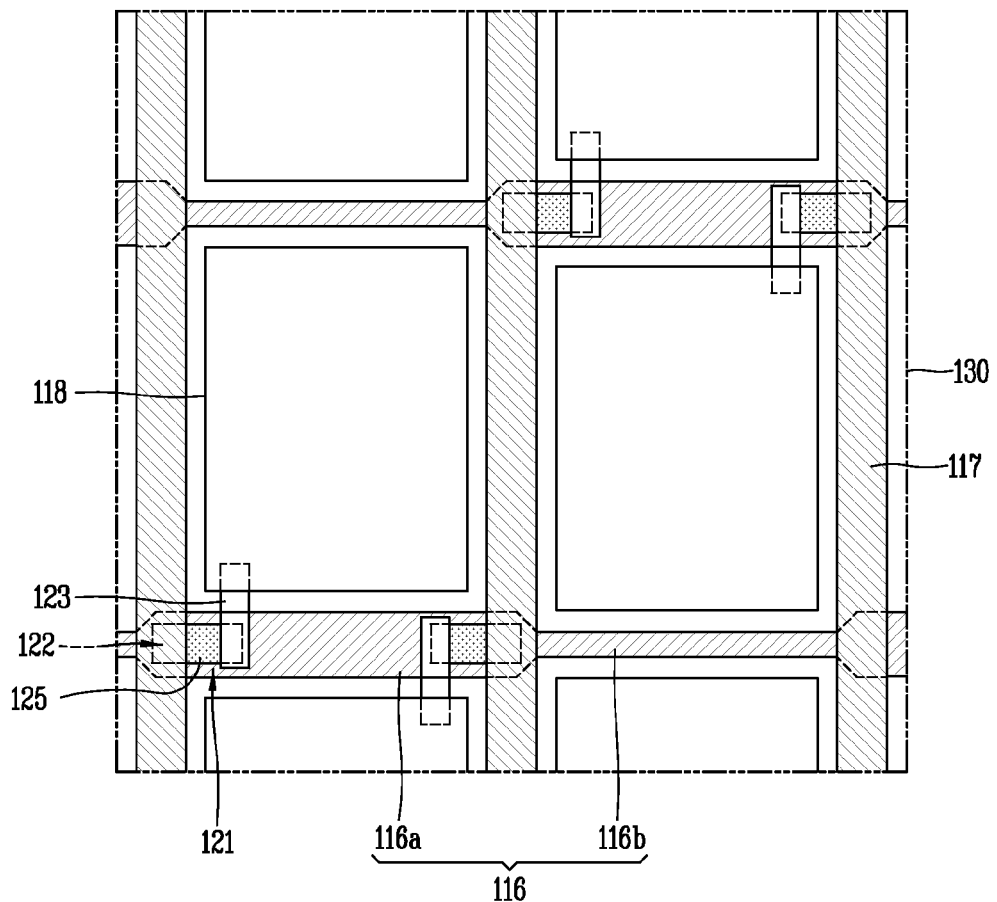

As shown in FIGS. 5C and 6C, opaque metal having superior conductivity, such as Cr, Mo, Ta, Cu, Ti, Al and Al alloy, is deposited on the first substrate 130 by a sputtering process. Then, the opaque metal is etched, thereby forming a data line 117 perpendicular to the gate line 116, and a drain electrode 123 facing the data line 117.

The data line 117 and the drain electrode 123 are formed above the semiconductor layer 125 formed on the gate line 116. That is, the semiconductor layer 125 is formed from a lower part of the data line 117, to a lower part of the drain electrode 123. The drain electrode 123 is formed in parallel to the data line 117, thus to face a predetermined region of the data line 117. The predetermined region of the data line 117 facing the drain electrode 123 serves as a source electrode 122 of a TFT. That is, even if the source electrode 122 and the data line 117 have the same configuration, they are classified from each other for convenience.

The semiconductor layer 125 extending from a lower part of the data line 117 to a lower part of the drain electrode 123, forms a channel region.

Transparent conductive material such as indium tin oxide (ITO) and indium zinc oxide (IZO) is deposited on a pixel region defined by the gate line 116 and the data line 117, and then is etched, thereby forming a pixel electrode 118. The pixel electrode 118 extends up to the upper part of the drain electrode 123 of the TFT, thus to be electrically connected to the drain electrode 123.

Figure 5D:
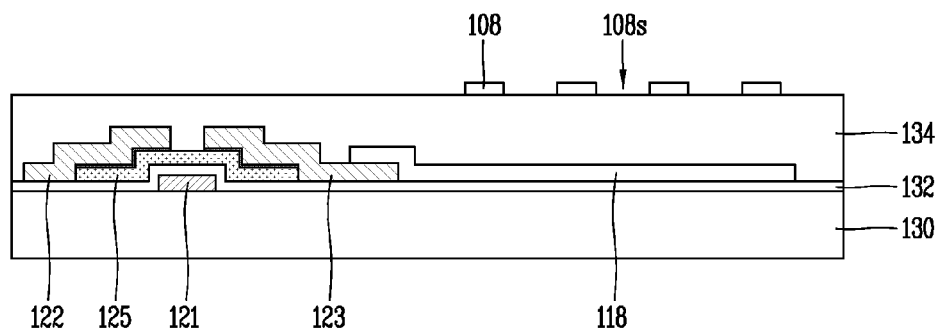
Figure 6D:
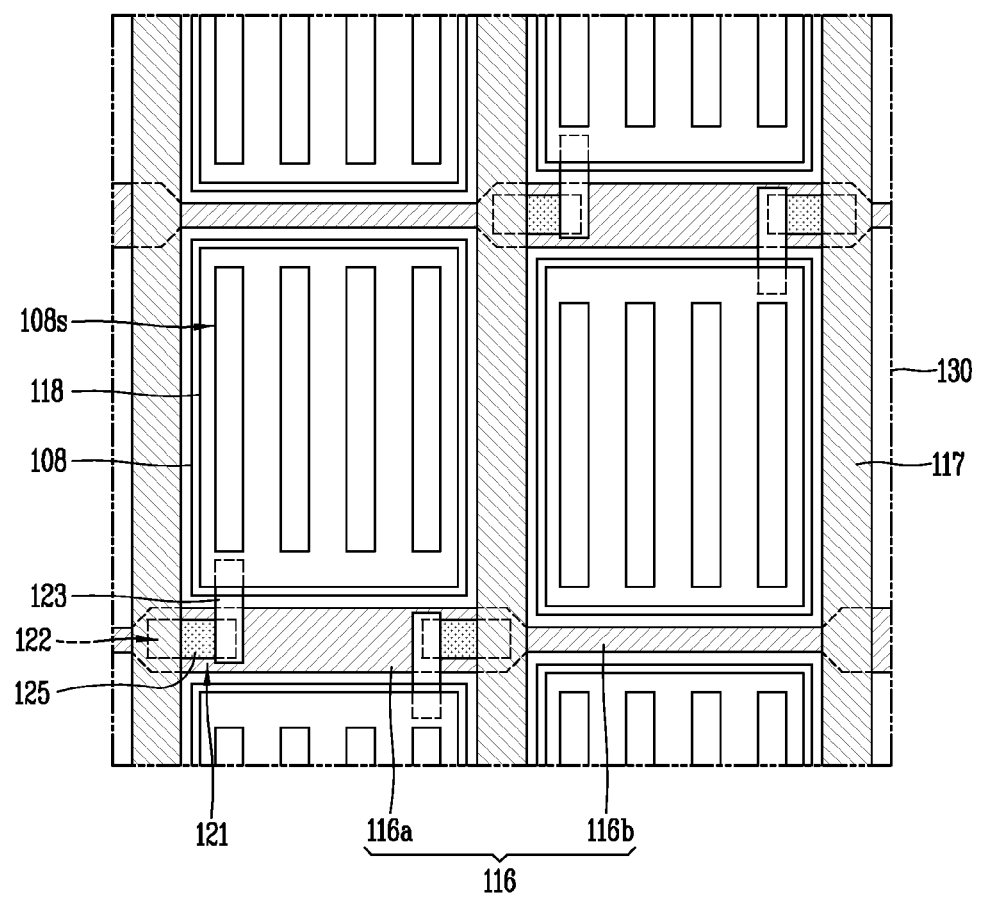

As shown in FIGS. 5D and 6D, organic insulating material such as benzo cyclo butane (BCB) and photo acryl, or inorganic insulating material such as SiOx and SiNx is deposited on the first substrate 130, thereby forming a passivation layer 134. Then, transparent conductive material having superior conductivity, such as ITO and IZO, is deposited on the passivation layer 134 and then is etched, thereby forming a common electrode 108. When etching the transparent conductive material, other transparent conductive material inside the pixel region is also etched, thereby forming a plurality of slits 108s in the pixel region. The slits 108s have a belt shape, and are formed in parallel to the data line 117. Inorganic insulating material such as SiOx and SiNx may be used as the passivation layer 204.

Although not shown, contact holes are formed on the gate insulation layer and the passivation layer 134, so that the common electrode 108 can be electrically connected to a common line through the contact holes. Here, the common line serves to apply a common voltage to the common electrode 108, which may be simultaneously formed with the gate line 116.

Figure 5E:
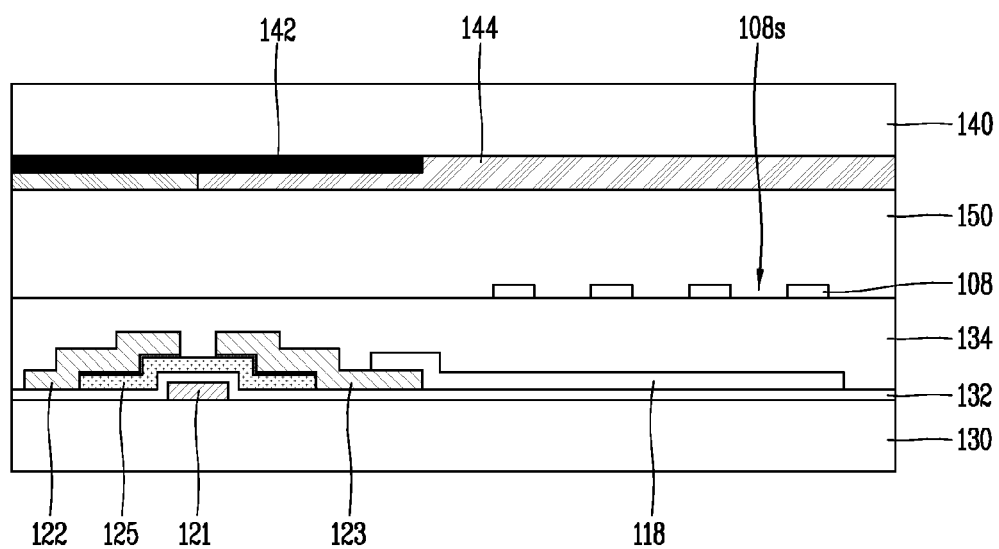
Figure 6E:
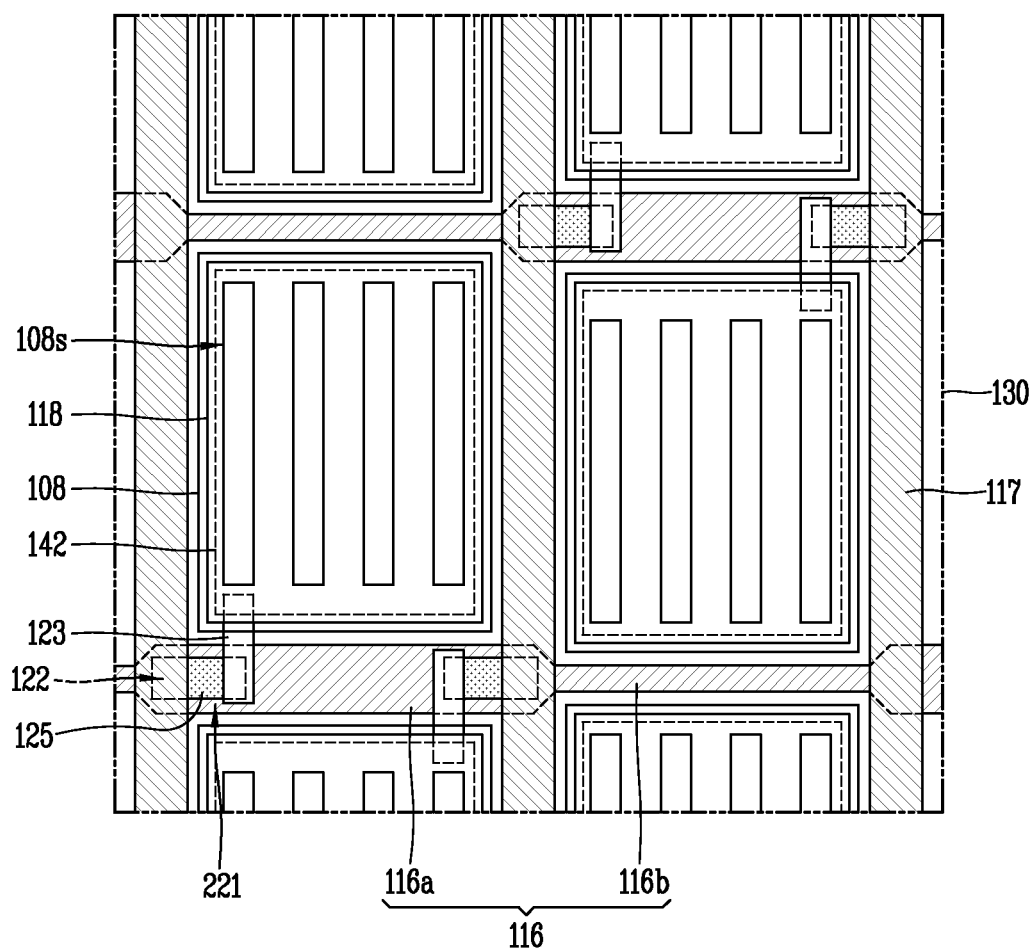

As shown in FIGS. 5E and 6E, opaque metal such as Ar and ArOx, or black resin is deposited, on a second substrate 140 formed of transparent material such as glass, and then is etched, thereby forming a black matrix 142. Then, RGB color ink or a color register is deposited to be patterned, thereby forming a color filter layer 144.

Next, the first substrate 130 and the second substrate 140 are attached to each other, and an LC layer 150 is disposed therebetween, thereby forming an LC panel.

Figure 7:
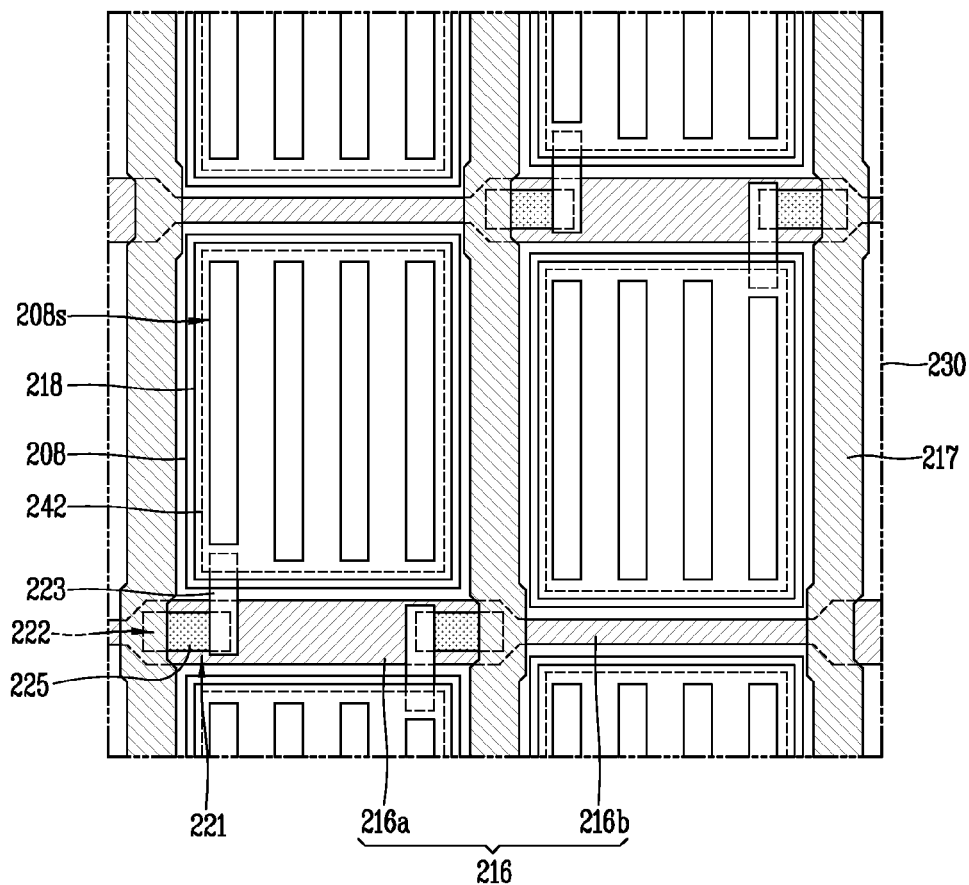
FIG. 7 is a view illustrating a structure of a liquid crystal display (LCD) device according to another embodiment of the present invention.

FIG. 7 is a view illustrating a structure of a liquid crystal display (LCD) device according to another embodiment of the present invention.

The structure of the LCD device of FIG. 7 is similar to that of FIG. 3A, and thus only the differences therebetween will be explained.

As shown in FIG. 7, in the LCD device according to another embodiment of the present invention, a plurality of gate lines 216 and data lines 217 are disposed in horizontal and vertical directions, thereby forming a plurality of pixel regions. If the gate line 216 has a first region 216a with a large width and a second region 216b with a small width, two TFTs 220 connected to the upper and lower pixel regions are formed on the first region 216a.

The TFT 220 includes a gate electrode 221 (part of the gate line 216), a semiconductor layer 225 formed at the first region 216a of the gate line 216, a source electrode 222 (part of the data line 217), and a drain electrode 223 formed on the gate line 216 in parallel to the data line 217. The semiconductor layer 225 extends from a lower part of the data line 217 corresponding to the source electrode 222, to a lower part of the drain electrode 223, thereby forming a channel layer on the gate line 216.

A region of the data line 217 on the gate line 216 is formed as a protruding region protruding from the first region 216a to the second region 216b at a contact interval. More specifically, a region of the data line 217 corresponding to the source electrode 222 has a shape implemented by a movement with a predetermined interval. The reason why the protruding region is formed at part of the data line 217, is in order to prevent lowering of performance of the TFT 220 by obtaining a channel layer of the TFT 220.

In the present invention, two TFTs 220 are formed, and two drain electrodes 223 are disposed to face different data lines 217, respectively. Generally, the size of a TFT occupies most of a pixel area. Since the size of the pixel of an LCD device decreases according to the recent trend, an area of the pixel occupied by the TFT increases more and more. Therefore, the interval between the drain electrode 223 and the data line 217 (source electrode), i.e., channel length should have a preset length. This may result in lowering of performance of the TFT 220.

In order to solve such problem, in this embodiment, a region of the data line 217 corresponding to the source electrode 222 is moved towards a direction far from the drain electrode 223. This can allow a sufficient channel length to be obtained.

A pixel electrode 218 and a common electrode 208 are formed in a pixel in a state where an insulation layer is disposed therebetween. The pixel electrode 218 is formed in a dummy pattern over a pixel region, and a plurality of slits 208s are formed at the common electrode 208. Accordingly, an electric field is formed between the edges of the slits 208s and the pixel electrode 218. Alternatively, the common electrode 208 may be formed in a dummy pattern over a pixel region, and a plurality of slits 208s may be formed at the pixel electrode 218.

Each of the pixel electrodes 218 connected to upper and lower parts of the first region 216a of the gate line 216, is connected to the drain electrode 223 disposed on the first region 216a. Accordingly, two adjacent pixels share a single gate line 216.

A black matrix 242 disposed on a second substrate is implemented, in a matrix form, along the gate lines 216 and the data lines 217. Accordingly, the black matrix 242 also has a protruding region in correspondence to the protruding region of the data line.

Figure 8A:
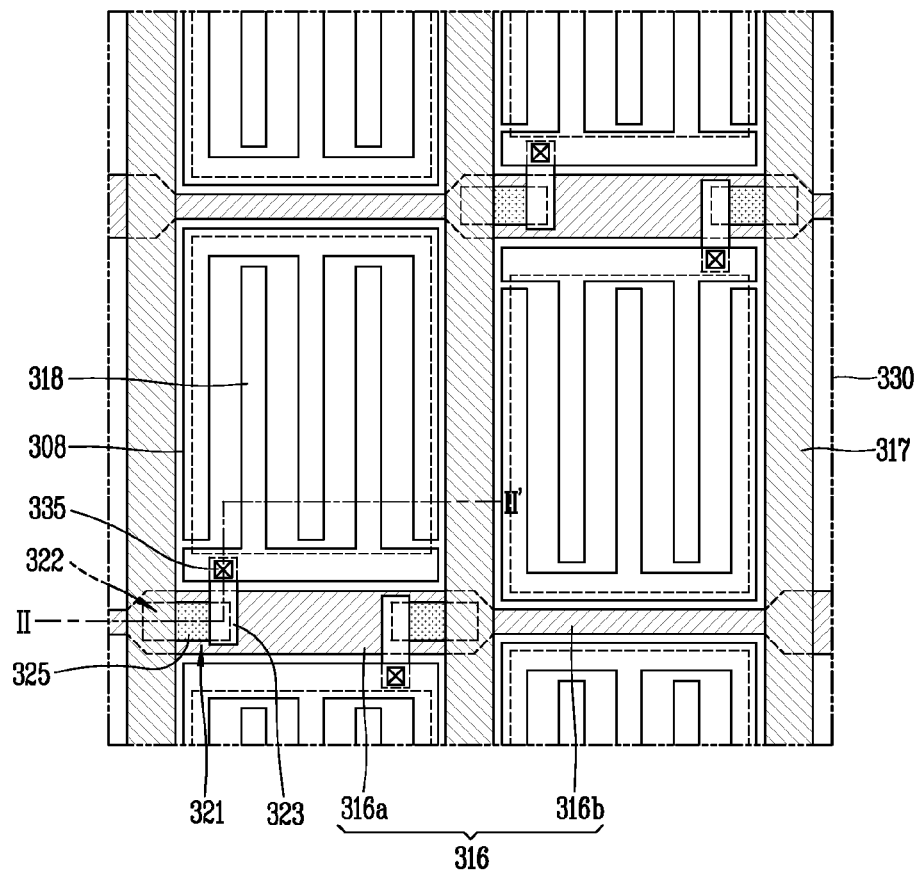
FIG. 8A is a sectional view illustrating a structure of a liquid crystal display (LCD) device according to still another embodiment of the present invention.
Figure 8B:
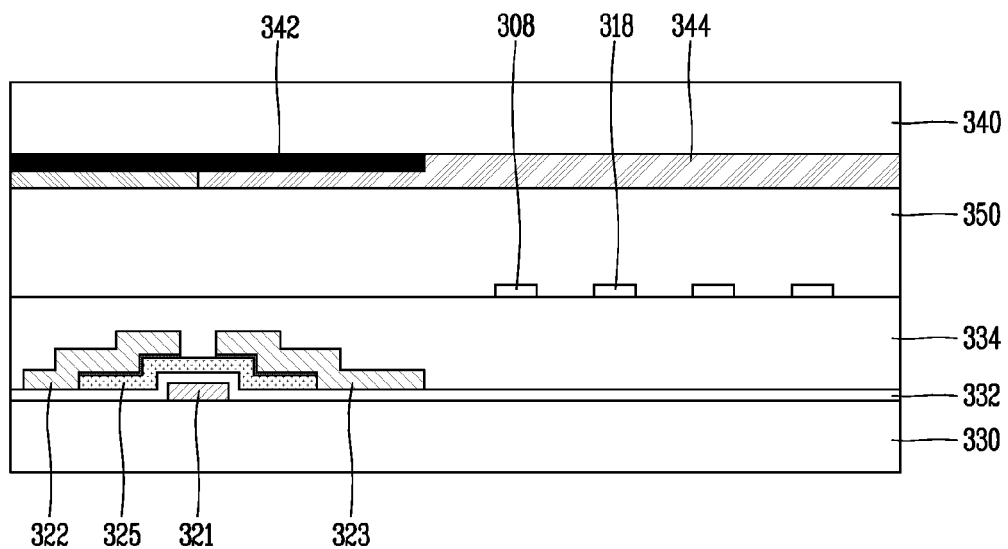
FIG. 8B is a sectional view taken along line II-II' in FIG. 8A.

FIG. 8A is a sectional view illustrating a structure of a liquid crystal display (LCD) device according to still another embodiment of the present invention, and FIG. 8B is a sectional view taken along line II-II' in FIG. 8A.

The same structure of the LCD device of FIG. 8 as that of FIG. 3A will not be explained, but only different structures will be explained.

As shown in FIG. 8A, in the LCD device according to still another embodiment of the present invention, a plurality of gate lines 316 and data lines 317 are disposed in horizontal and vertical directions, thereby forming a plurality of pixel regions.

A TFT 320 includes a gate electrode 321 (part of the gate line 316), a semiconductor layer 325 formed at a first region 316a of the gate line 316, a source electrode 322 (part of the data line 317), and a drain electrode 323 formed on the gate line 316 in parallel to the data line 317. The semiconductor layer 325 extends from a lower part of the data line 317 corresponding to the source electrode 322, to a lower part of the drain electrode 323, thereby forming a channel layer on the gate line 316.

Two drain electrodes 323 are disposed on a first region 316a of the gate line 316, so as to face adjacent data lines 317, respectively. Accordingly, two TFTs 320 are formed on the gate line 316.

A common electrode 308 and a pixel electrode 318 are formed in a pixel region. The common electrode 308 and the pixel electrode 318 are formed in a belt shape, and are disposed in a pixel in parallel to each other. The pixel electrodes 318 disposed up and down based on the gate line 316, are connected to the two drain electrodes 323 formed on the gate line 316, respectively. Accordingly, as a scan signal is applied along the gate line 316, the two TFTs are respectively driven. At the same time, image signals are applied to the pixel electrode 318 of the adjacent pixel region.

As shown in FIG. 8B, as the common electrode 308 and the pixel electrode 318 are formed on a passivation layer 334, a horizontal electric field parallel to the surface of a first substrate 330 is applied to an LC layer 350. As shown in FIG. 8A, the pixel electrode 318 is electrically connected to the drain electrode 323 of the TFT 320, through a contact hole of the passivation layer 334.

The pixel electrode 318 and the common electrode 308 may be formed on the same layer, e.g., the first substrate 330 or the gate insulation layer 332. Alternatively, the pixel electrode 318 and the common electrode 308 may be formed on different layers.

As aforementioned, in the present invention, the gate line is formed in a zigzag shape having different widths. And, two TFTs are formed at the gate line having a large width, and are connected to pixel electrodes adjacent to each other based on the gate line, respectively. Accordingly, two adjacent pixels share a single gate line. The gate line is formed such that large widths and small widths are alternately disposed with each other, and such that TFTs are formed only at the large widths. A region blocked by a black matrix with a large width is similar to that blocked by the conventional black matrix. Therefore, an aperture ratio and a transmittance ratio of a pixel region adjacent to the gate line with a small width are greater than those of the conventional pixel region. This can enhance the entire aperture ratio and transmittance ratio of the LCD device.

In the above description, the present invention is applied to an LCD device of a specific structure. However, the present invention is not limited to this. For instance, the present invention may be also applied to LCD devices of various structures, such as an In Plane Switching (IPS) mode LCD device, a Fringe Field Switching (FFS) mode LCD device, a Twisted Nematic (TN) mode LCD device and a Vertical Alignment (VA) mode LCD device.

More specifically, the present invention may be applied to an LCD device of any structure, only if large widths and small widths of a gate line are alternately formed with each other in horizontal and vertical directions, and two TFTs are formed on the gate line with a large width thus to be connected to pixels adjacent to each other in upper and lower directions.

The foregoing embodiments and advantages are merely exemplary and are not to be considered as limiting the present disclosure. The present teachings can be readily applied to other types of apparatuses. This description is intended to be illustrative, and not to limit the scope of the claims. Many alternatives, modifications, and variations will be apparent to those skilled in the art. The features, structures, methods, and other characteristics of the exemplary embodiments described herein may be combined in various ways to obtain additional and/or alternative exemplary embodiments.

As the present features may be embodied in several forms without departing from the characteristics thereof, it should also be understood that the above-described embodiments are not limited by any of the details of the foregoing description, unless otherwise specified, but rather should be considered broadly within its scope as defined in the appended claims, and therefore all changes and modifications that fall within the metes and bounds of the claims, or equivalents of such metes and bounds are therefore intended to be embraced by the appended claims.

What is claimed is:

1. A liquid crystal display (LCD) device, comprising:
a first substrate and a second substrate;
a plurality of gate lines formed on the first substrate, each gate line having a first region and a second region with the width less than that of the first region;
a plurality of data lines disposed so as to be perpendicular to the gate lines to define a plurality of pixel regions;
a thin film transistor (TFT) formed on the first region of the gate line;
a common electrode and a pixel electrode formed on the first substrate, and forming an electric field;
a black matrix and a color filter layer formed on the second substrate; and
a liquid crystal (LC) layer formed between the first substrate and the second substrate,
wherein the first regions and the second regions of the gate lines are alternately disposed in an extending direction of the gate lines and in an extending direction of the data lines, and
wherein two TFTs are formed on the first region of the gate line corresponding to two pixel regions, two TFTs being respectively connected to pixel electrodes of two pixel regions adjacent to each other based on the gate line.

2. The LCD device of claim 1, wherein the thin film transistor includes:
a gate insulation layer formed over the substrate having the gate lines formed thereon;
a semiconductor layer formed on the gate insulation layer over the first region of the gate line;
a drain electrode formed on the semiconductor layer; and
a passivation layer formed on the drain electrode,
wherein the semiconductor layer extends from a lower portion of the data line to a lower portion of the drain electrode to form a channel layer, and a part of the data line serves as a source electrode.

3. The LCD device of claim 2, wherein drain electrodes of two TFTs formed on a single gate line in a pixel region are disposed in parallel to a data line of a corresponding pixel and a data line of an adjacent pixel, thereby facing the data lines.

4. The LCD device of claim 1, wherein an area of a pixel region corresponding to the first region of the gate line is smaller than that of a pixel region corresponding to the second region.

5. The LCD device of claim 3, wherein a region of the data line corresponding to the source electrode protrudes in the extension direction of the gate line to be far from the drain electrode.

6. The LCD device of claim 1, wherein the pixel electrode is formed on a gate insulation layer in a dummy pattern, and the common electrode is formed on a passivation layer so that a plurality of slits extending in an extending direction of the data line are formed.

7. The LCD device of claim 1, wherein the pixel electrode is formed on a passivation layer to form a plurality of slits and the common electrode is formed on the first substrate in a dummy pattern.

8. The LCD device of claim 1, wherein the pixel electrode and the common electrode are disposed in parallel to each other, in a belt shape.

9. A method for fabricating a liquid crystal display (LCD) device, the method comprising:
   providing a first substrate and a second substrate;
   forming a plurality of gate lines on the first substrate, each gate line including as first regions and second regions having a smaller width than that of the first regions are alternately disposed with each other;
   forming a gate insulation layer over the first substrate having the gate lines formed thereon;
   forming two semiconductor layers on the gate insulation layer above the first region of the gate line;
   forming data lines and drain electrodes on the semiconductor layer, the data lines perpendicular to the gate lines to define a plurality of pixel regions, the drain electrodes facing with a part of the data lines;
   forming a passivation layer over the first substrate having the drain electrodes formed thereon;
   forming a black matrix and a color filter layer on the second substrate corresponding to the gate lines and the data lines of the first substrate; and
   attaching the first substrate and the second substrate to each other, and forming a liquid crystal layer between the first and second substrates.

10. The method of claim 9, further comprising a pixel electrode and a common electrode in each pixel region.

11. The method of claim 9, wherein forming a pixel electrode and a common electrode in the pixel region includes:
   forming a pixel electrode in a dummy pattern on the gate insulation layer in the pixel region; and
   forming a common electrode having a plurality of slits formed thereat, on the passivation layer in the pixel region.

12. The method of claim 9, wherein the step of forming a pixel electrode and a common electrode in a pixel region includes:
   forming a common electrode in a dummy pattern on the first substrate in the pixel region; and
   forming a pixel electrode having a plurality of slits on the passivation layer in the pixel region.

13. The method of claim 9, wherein the step of forming a pixel electrode and a common electrode in a pixel region further includes forming a plurality of common electrodes and pixel electrodes parallel to each other on the passivation layer in a pixel region.

* * * * *